US007217142B1

(12) United States Patent
Wu

(10) Patent No.: US 7,217,142 B1
(45) Date of Patent: May 15, 2007

(54) CABLE CONNECTOR ASSEMBLY WITH IMPROVED CONTACTS

(75) Inventor: Jerry Wu, Irvine, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/481,151

(22) Filed: Jul. 3, 2006

(51) Int. Cl.
*H01R 12/00* (2006.01)
*H05K 1/00* (2006.01)

(52) U.S. Cl. ......................... 439/79; 439/610; 439/700

(58) Field of Classification Search ................ 439/610, 439/78, 79, 83, 700, 924.1, 541.5, 881
See application file for complete search history.

(56) References Cited

U.S. PATENT DOCUMENTS 5,244,415 A * 9/1993 Marsilio et al. ............ 439/610
5,346,406 A * 9/1994 Hoffman et al. ............ 439/474
5,364,292 A 11/1994 Bethurum
5,719,753 A * 2/1998 Taylor ........................ 361/812
6,210,229 B1 * 4/2001 Lai ............................ 439/610
6,290,530 B1 * 9/2001 Chang ........................ 439/378
6,336,827 B1 * 1/2002 Akama et al. .............. 439/610
6,341,961 B1 * 1/2002 Juntwait ...................... 439/63
6,617,518 B2 * 9/2003 Ames et al. ................ 174/254
6,663,415 B1 12/2003 Wu
6,716,043 B2 * 4/2004 Ishizuka ..................... 439/131
6,719,574 B2 * 4/2004 Grek ........................... 439/79
6,733,333 B1 5/2004 Chen
6,773,312 B2 8/2004 Bauer et al.
6,814,626 B2 11/2004 Wen-Yao
6,887,096 B2 * 5/2005 Matumoto et al. .......... 439/489

* cited by examiner

*Primary Examiner*—Hae Moon Hyeon
(74) *Attorney, Agent, or Firm*—Wei Te Chung

(57) ABSTRACT

A cable connector assembly (100) includes a housing (2), a number of POGO-type contacts (31, 32, 33) received in the housing, a circuit board (4) assembled to the housing, a number of conductive elements (34) each including a connecting portion (340) soldered with corresponding contact and a tail portion (342) soldered with the circuit board, a cable (6) electrically connecting with the circuit board, a metal front cover (1) assembled to the housing and a rear cover (7) assembled to the housing to enclose the rear of the housing, the contacts, the circuit board and the front end of the cable.

16 Claims, 25 Drawing Sheets

100

CABLE CONNECTOR ASSEMBLY WITH IMPROVED CONTACTS

BACKGROUND OF THE INVENTION

1. Field of the Invention

The present invention generally relates to a cable connector assembly, and more particularly to a cable connector assembly used for power transmission.

2. Description of Related Art

POGO-type contacts are widely used for chargeable batteries. Such contact as disclosed in U.S. Pat. No. 6,773,312, usually comprises a pin assembled with a spring, a sleeve receiving the pin and the spring, and a mounting portion exposed outside the sleeve for electrically connecting with a printed circuit board. With development of technology, different structures of such type contact are designed to meet different requirements. U.S. Pat. No. 6,814,626 discloses a compression contact having a U-shape mounting portion having tabs pressing against the spring and a bottom portion for surface-mounting to a Printed Circuit Board (PCB) perpendicular to the extending direction of the contact. However, such type mounting portion is relatively complex in structure and not suitable for a cable connector assembly.

BRIEF SUMMARY OF THE INVENTION

Accordingly, an object of the present invention is to provide a cable connector assembly with improved contact structure for achieving more reliable connection.

In order to achieve the above-mentioned object, a cable connector assembly in accordance with the present invention comprises an insulative housing defining a plurality of receiving passages extending therethrough, a plurality of contacts respectively received in the receiving passages, a circuit board assembled to the housing and electrically connecting with the contacts, a cable electrically connecting with the circuit board, front and rear covers assembled to the housing. Each contact comprises a mating portion exposed beyond corresponding receiving passage, a media portion engagingly received in said receiving passage, and an end portion exposed beyond said receiving passage. A plurality of conductive elements electrically connect with the circuit board and the contacts. Each conductive element comprises a connecting portion electrically connecting with the end portion of corresponding contact and a tail portion soldered with one end of the circuit board.

Other objects, advantages and novel features of the invention will become more apparent from the following detailed description of the present embodiment when taken in conjunction with the accompanying drawings.

DETAILED DESCRIPTION OF THE INVENTION

Figure 1:
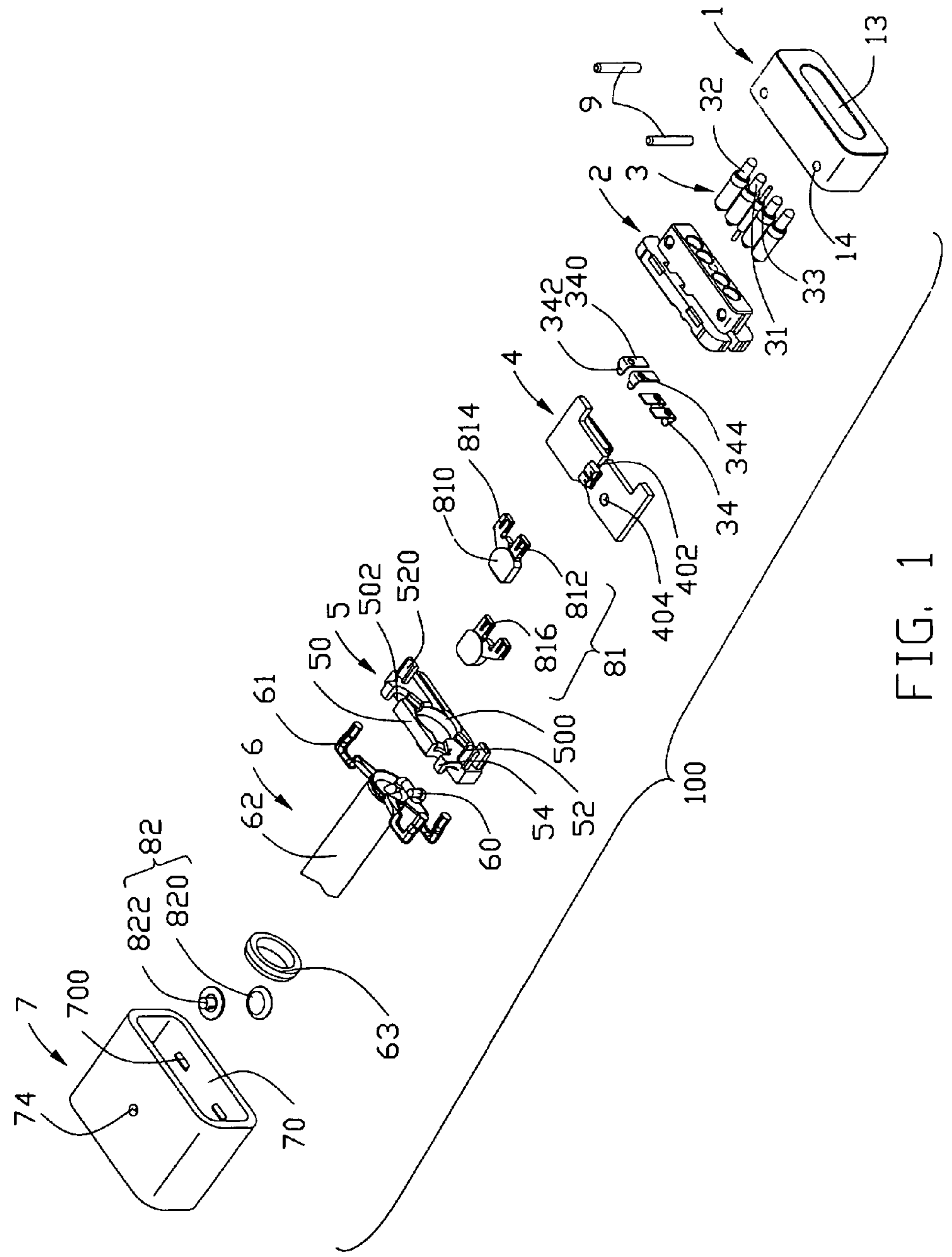
FIG. 1 is an exploded, perspective view of a cable connector assembly in accordance with the first embodiment of the present invention.

Reference will now be made to the drawing figures to describe the present invention in detail.

Figure 2:
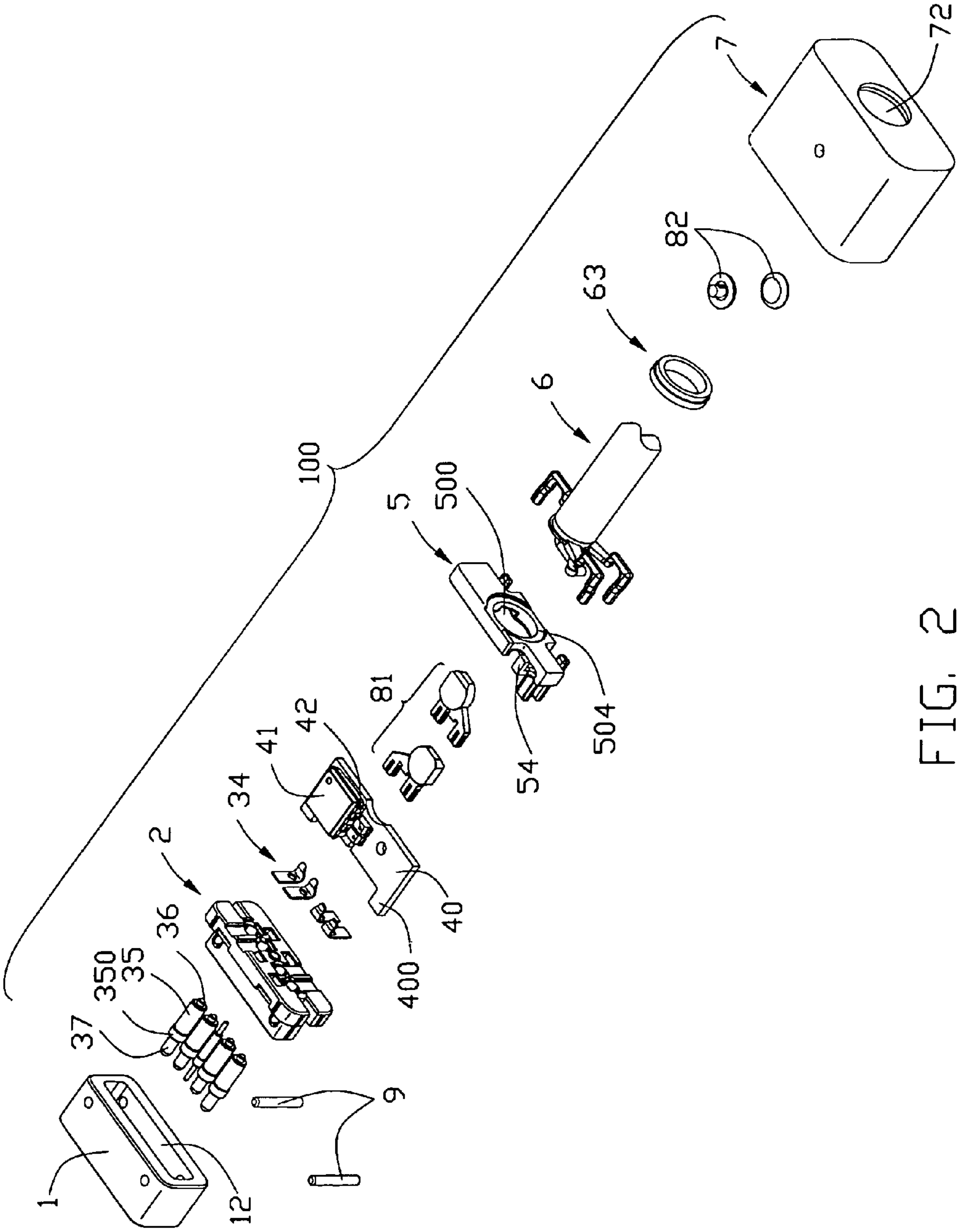
FIG. 2 is a view similar to FIG. 1, but viewed from a different aspect.
Figure 3:
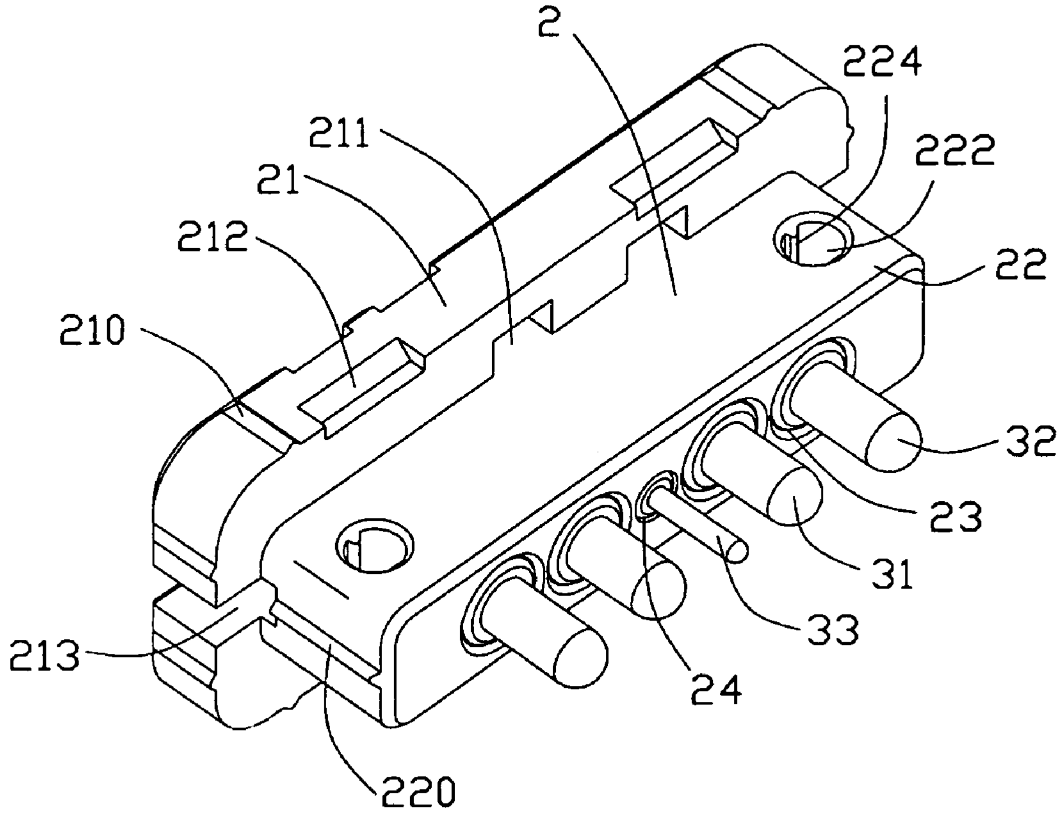
FIG. 3 is a partially assembled view of the cable connector assembly of FIG. 1.

Referring to FIGS. 1–3, a cable connector assembly 100 in accordance with the first embodiment of the present invention comprises an insulative housing 2, a plurality of conductive contacts 3 assembled to the housing 2, a circuit board 4 assembled to the housing 2, a plurality of conductive elements 34 respectively electrically connecting with the contacts 3 and the circuit board 4, a strain relief member 5 assembled to and electrically connecting with the circuit board 4, a cable 6 electrically connecting with the strain relief member 5 to achieve the electrical connection with the circuit board 4, front and rear covers 1, 7 respectively assembled to the housing 2 and together enclosing the elements mentioned above therebetween.

Figure 4:
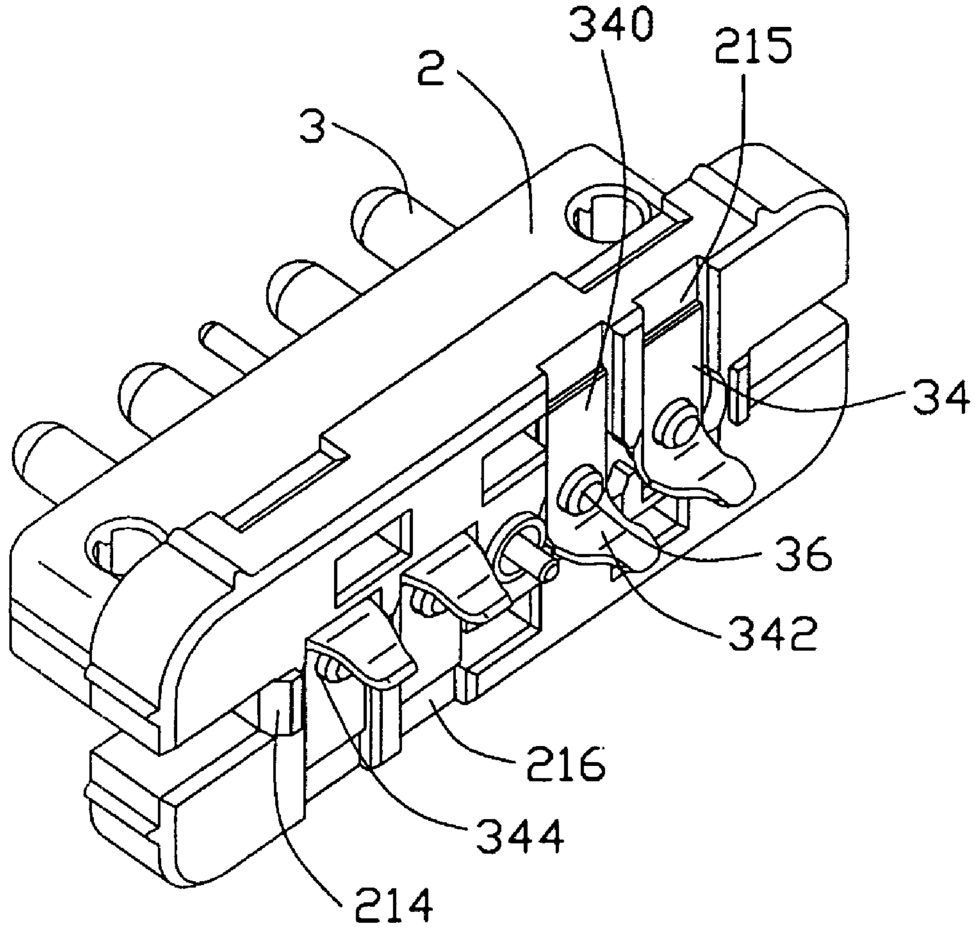
FIG. 4 is a view similar to FIG. 3, but viewed from a different aspect.

Please refer to FIGS. 3–4, the housing 2 comprises a base portion 21 and a tongue portion 22 extending forwardly from the base portion 21. The housing 2 defines two pairs of large-size first receiving passages 23 and a center small-size second receiving passage 24 respectively recessed from a front face of the tongue portion 22 to a rear face of the base portion 21. Each passage 23, 24 is formed with a relatively larger dimension in a front portion thereof and a relatively smaller dimension in remaining portion thereof. The base portion 21 forms a plurality of first friction ribs 210 arranged on outer periphery of the base portion 21 with an interval and extending along a front-to-back direction. A pair of cutouts 212 are respectively spaced arranged at joints of upper, lower surfaces and a front face of the base portion 21 with a tapered surface. The base portion 21 defines two pairs of rectangular first slots 211 spaced arranged in upper and lower walls and respectively recessed from the front face to the rear face thereof with determined distance from respective top and bottom surfaces. The base portion 21 also defines a pair of second slots 213 extending along the front-to-back direction to communicate the front face with opposite rear face and recessed inwardly from opposite lateral walls thereof. A pair of tapered protrusions 214 are formed on the rear face of the base portion 21 and locate adjacent to corresponding second slots 213 for facilitating the insertion of the circuit board 4. A pair of first rectangular recesses 215 and a pair of second rectangular recesses 216 with opening toward opposite contrary directions respectively recessed forwardly from the rear face of the base portion 21 and respectively communicating with the first receiving passages 23. The tongue portion 22 defines a pair of circular first engaging holes 222 extending therethrough along up-to-down direction and forms a pair of second friction ribs 220 on opposite lateral walls thereof extending along the front-to-back direction. Each engaging hole 222 forms a pair of ribs 224 protruding outwardly from inner periphery thereof.

Now referring to FIGS. 1–4, the conductive contacts 3 consist of a pair of ground contacts 32, a pair of power contacts 31 located between the pair of ground contacts 32 and a center detect contact 33 located between the pair of power contacts 31. Each contact 3 is of a POGO Pin type, that is to say, there is a spring (not shown) inside the contact 3, thus, when mating, the contact 3 can be pressed to rearward move along the mating direction. Each ground contact 32 comprises a column-shape contacting portion 37 with a relatively small diameter, a column-shape media portion 35 with a relatively large diameter, and an end portion 36 formed at rear end of the media portion 35 with a column-shape and smaller diameter. A front engaging section 350 protrudes outwardly from outer periphery of the media portion 35. The power contact 32 has the same structure as that of the ground contact 31 except the contacting portion 37 thereof has a length shorter than that of the ground contact 31. The detect contact 33 has the same structure as that of the power contact 32 except each portion thereof has a smaller diameter than that of the power contact 32. In addition, the end portion 36 of the detect contact 33 is longer than that of the power or ground contacts 31, 32.

Referring to FIGS. 1–2 and 4, the conductive elements 34 are divided into two groups respectively oriented in opposite directions. Each conductive element 34 is of L-shape and comprises an upright connecting portion 340 defining a circular receiving opening 344 therein, and a curved tail portion 342 substantially vertically extending from the connecting portion 340.

Referring to FIGS. 1–2, the circuit board 4 comprises a substrate 40 formed with first conductive pads and opposite second conductive pads (not shown), and a pair of Light Emitting Diodes (LEDs) 42 arranged on opposite sides of the substrate 40. The circuit board 4 may be equipped with an Integrated Circuit (IC) 41 for driving the LEDs 42 to emit light. The substrate 40 comprises a pair of stretching arms 400 extending forwardly from opposite lateral sides thereof and defines a wire-receiving hole 404 in a rear portion thereof.

The strain relief member 5 is die casted from metal material or other conductive material. The strain relief member 5 comprises a main portion 50 defining a circular through hole 500 in a center thereof. Three corners of the main portion 50 are cutout to form three L-shape cutout areas 502. Three jointing portions 52 respectively forwardly extending from a front surface of the main portion 50 and respectively located adjacent to both corresponding cutout area 502 and corresponding lateral side of the main portion 50. Three substantially L-shape routing portions 54 firstly vertically extending from bottoms of corresponding cutout areas 502, then flatly extending into the three cutout areas 502. In the vertical direction, each routing portion 54 does not align with corresponding jointing portion 52. Each jointing portion 52 is partially cut to form a curved recess area 520 mainly extending in the front-to-back direciton. A substantially circular receiving opening 504 recesses forwardly from a rear surface of the main portion 50 to communicate with the through hole 500 with a larger diameter than that of the through hole 500.

The cable 6 comprises an inner conductor 60, a metal braiding layer 61 surrounding the inner conductor 60, and an outer jacket 62 enclosing the metal braiding layer 61. A front portion of the outer jacket 62 is stripped to expose part of the inner conductor 60 and the metal braiding layer 61. In this embodiment, the exposed portion of the metal braiding layer 61 is divided into three parts corresponding to the routing portions 54 and the jointing portions 52 of the strain relief member 5. The cable 6 may be equipped with a stepped-shape stuffing member 63 made from resin material.

Figure 11:
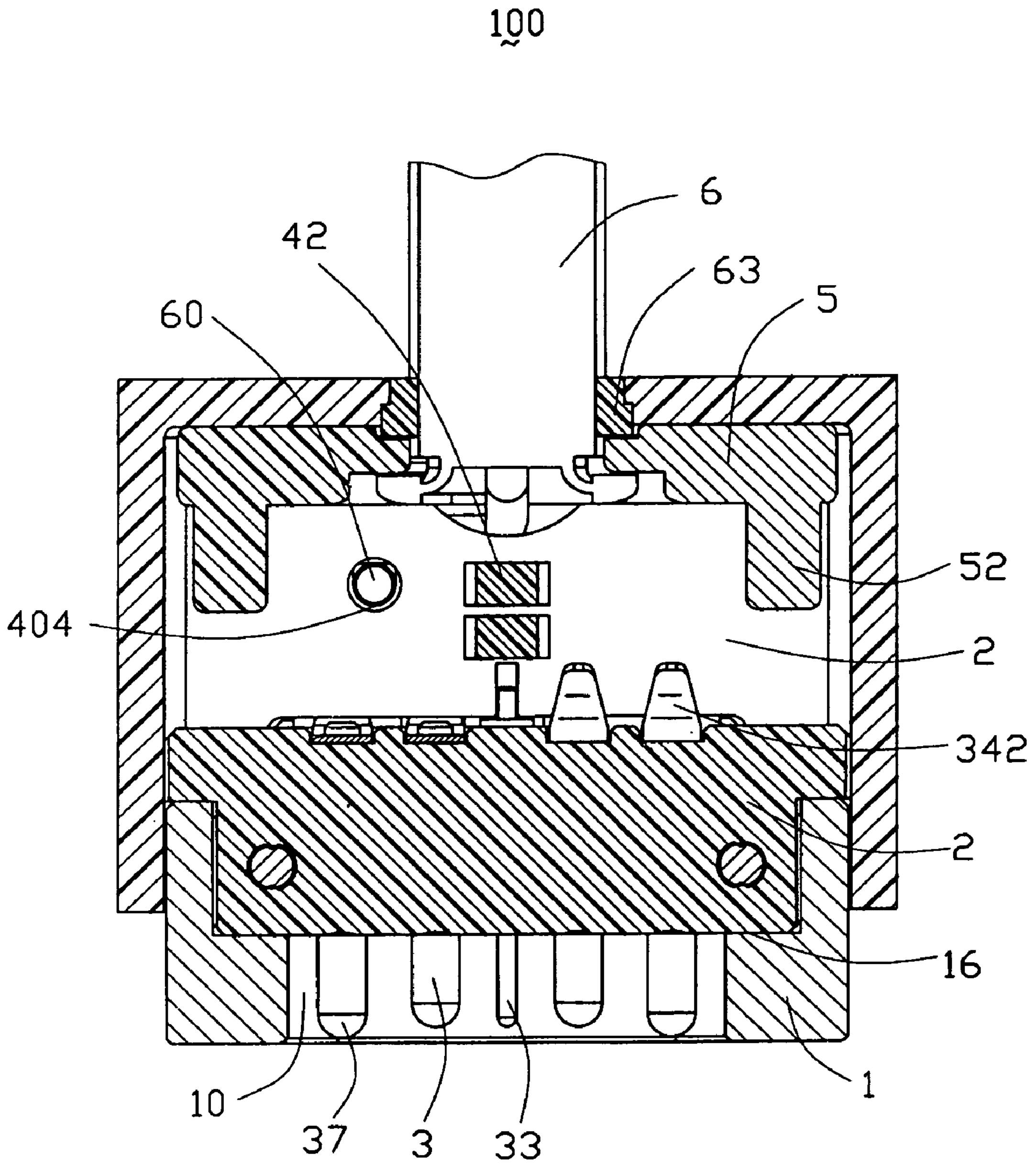
Figure 12:
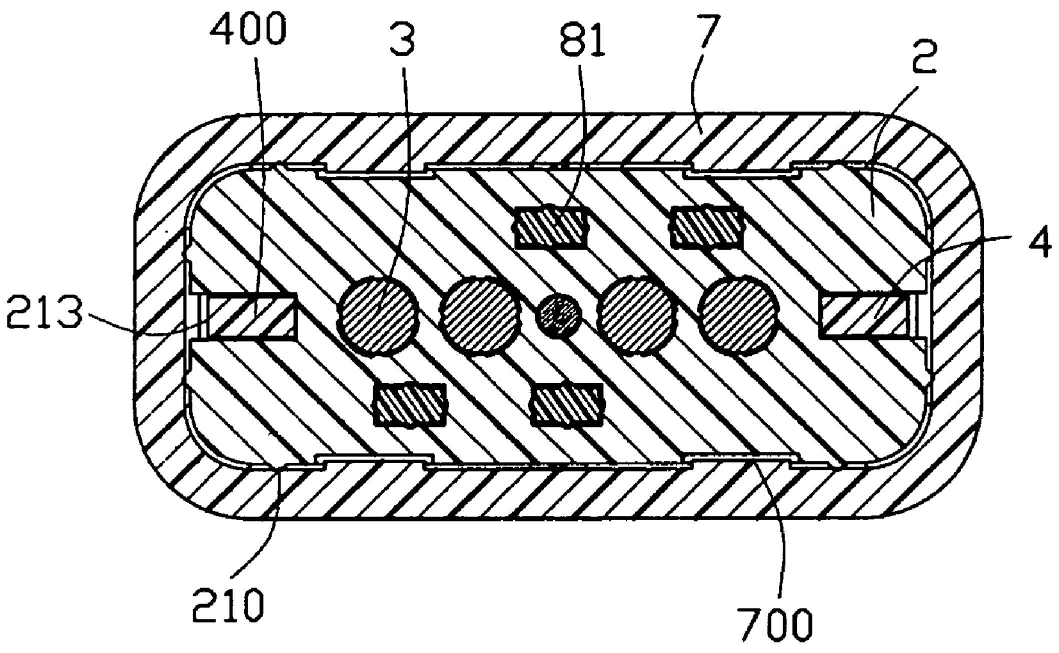

The front and rear covers 1, 7 are respectively assembled to the housing 2. The front cover 1 is made from conductive material and defines an elliptical-shape front receiving cavity 10 recessed rearwardly from a front surface thereof for receiving complementary connector and a rectangular rear receiving passage 12 recessed forwardly from a rear surface thereof to communicate with the front receiving cavity 10 for receiving the housing 2. The receiving passage 12 has a large size along a lateral direction of the front cover 1 than that of the receiving cavity 10, thus, forming a pair of step portions 16 therebetween (FIG. 11). The front cover 1 also defines a pair of circular second engaging holes 14 respectively recessed from a top surface to opposite rear surface thereof and locating adjacent to the rear surface thereof. The rear cover 7 is made from resin material and of rectangular shape. The rear cover 7 defines a rectangular receiving space 70 recessed rearwardly from a front surface thereof and a rear stepped receiving passage 72 communicating with the receiving space 70 for permitting the protruding of the cable 6 and receiving the stuffing member 63. The rear cover 7 forms two pairs of protrusions 700 on opposite inner upper wall and opposite lower wall thereof and a pair of circular receiving holes 74 extending through top and bottom surfaces thereof.

The cable connector assembly 100 also comprises status indicator means (not labeled) made of transparent material or semitransparent material and consisting of a pair of first light pipes 81 overlapping the pair of LEDs 42 for spreading the light emitted by the LEDs 42 outwardly, and a pair of second light pipes 82 aligned with corresponding first light pipes 81 in a vertical direction and assembled to the rear cover 7 to spread the light permeated by the first light pipes 81 outwardly for indicating the normal status of the cable connector assembly 100. Each first light pipe 81 comprises a first body section 810 and a pair of first and second engaging sections 812, 814 respectively extending forwardly and sideward then forwardly from the first body section 810, thus, the pair of first and second engaging sections 812, 814 are spaced arranged along the lateral direction. In addition, each engaging section 812, 814 forms a pair of ribs 816 on opposite upper and lower surfaces thereof. The second light pipe 82 comprises a second body section 820 and a post-shape positioning section 822 extending outwardly from a center of the second body section 820. In assembly, the pair of first light pipes 81 and the pair of second light pipes 82 are respectively arranged in image relationship relative to each other.

Figure 10:
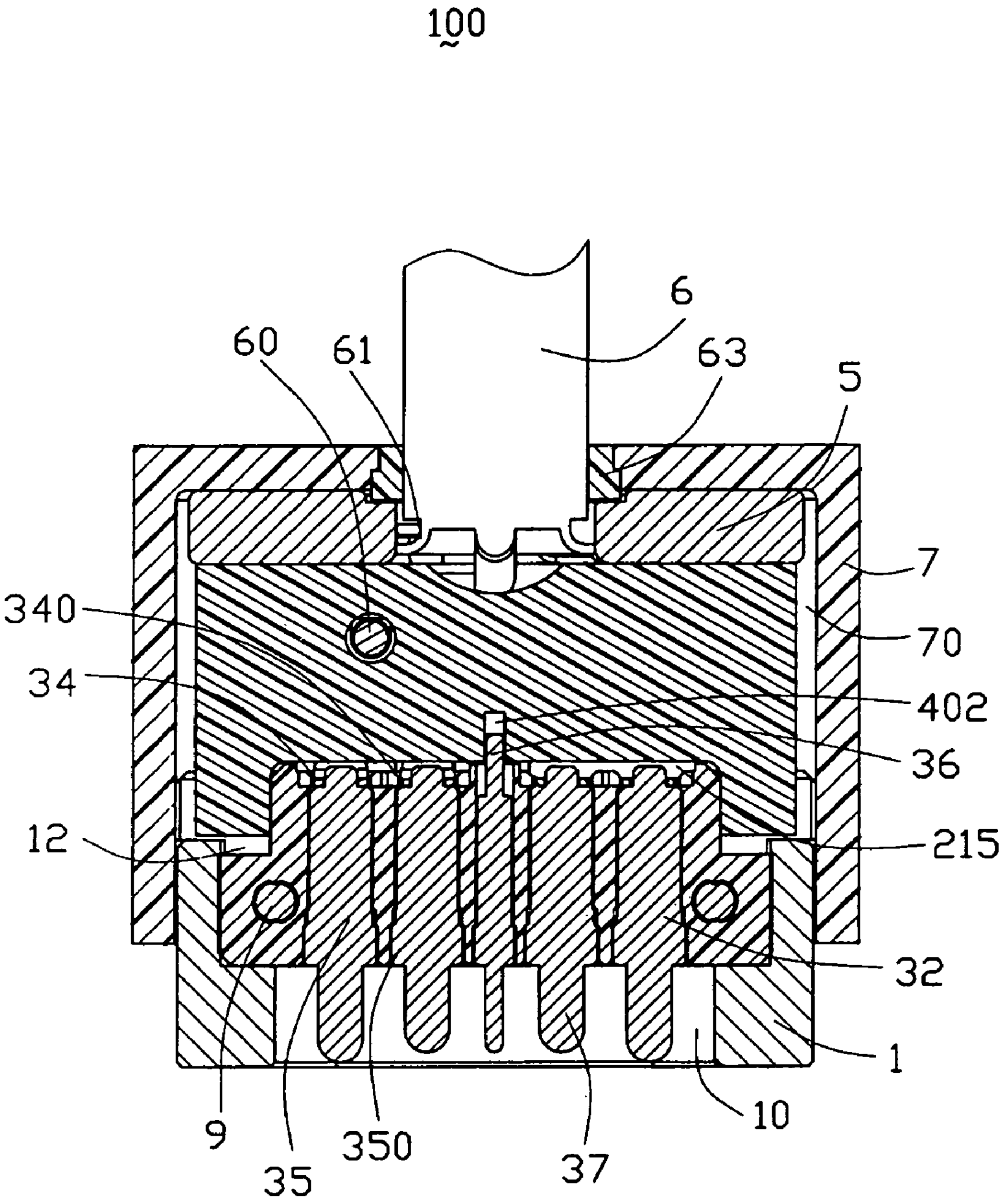

Referring to FIGS. 3–6 in conjunction with FIGS. 10–11, in assembly, the conductive contacts 3 are assembled to the housing 2 with the media portions 35 of the power contacts 31, ground contacts 32 and the detect contact 33 respectively received in corresponding first and second receiving passages 23, 24, the contacting portions 37 exposed beyond the front surface of the housing 2. The end portions 36 of the power and ground contacts 31, 32 are respectively received in the first and second recesses 215, 216 and extend no longer than the rear surface of the housing 2, while, the end portion 36 of the detect contact 33 extends beyond the rear surface of the housing 2. The conductive elements 34 are respectively assembled to the housing 2 and the power and ground contacts 31, 32 with the connecting portions 340 received in corresponding first and second recesses 215, 216 of the housing 2 and corresponding end portions 36 of the power and ground contacts 31, 32 protruding through the receiving openings 344 and soldered with the connecting portions 340. Thus, the conductive elements 34 form electrical connection with corresponding power and ground contacts 31, 32.

Figure 7:
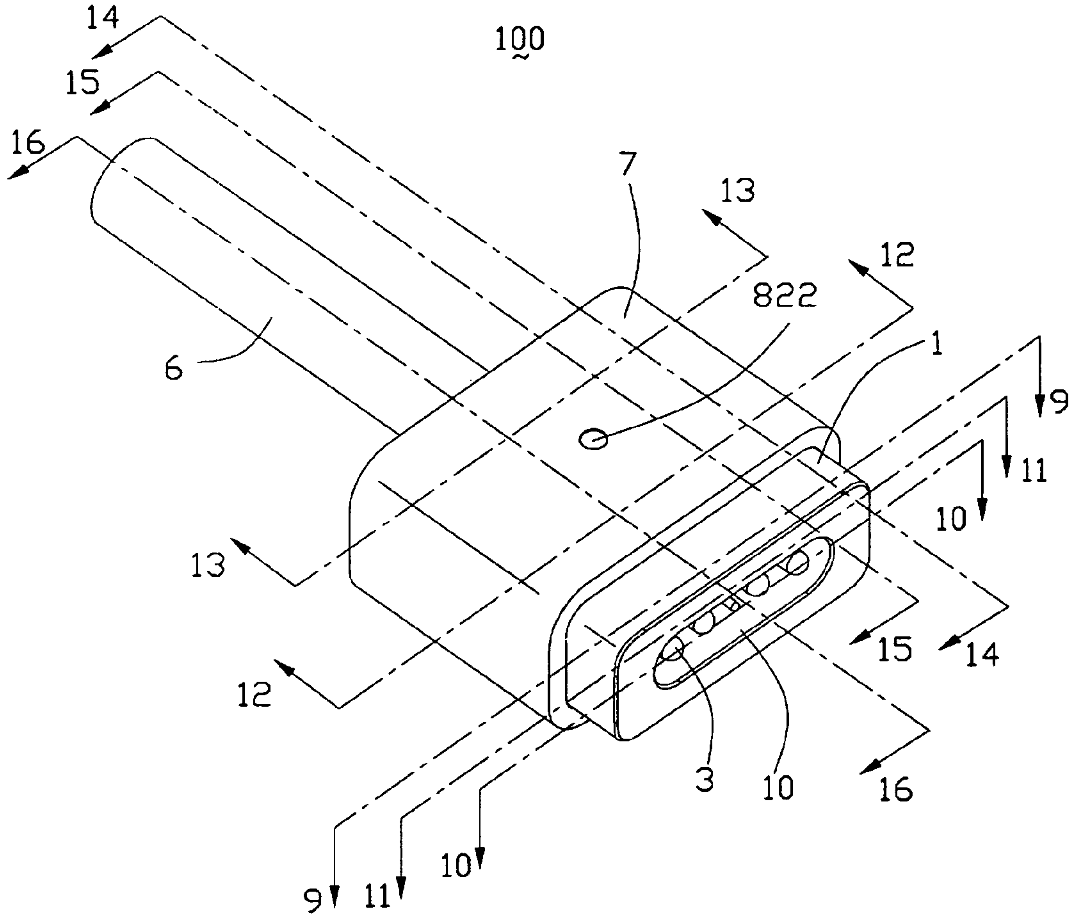
FIG. 7 is an assembled view of the cable connector assembly of FIG. 1.
Figure 8:
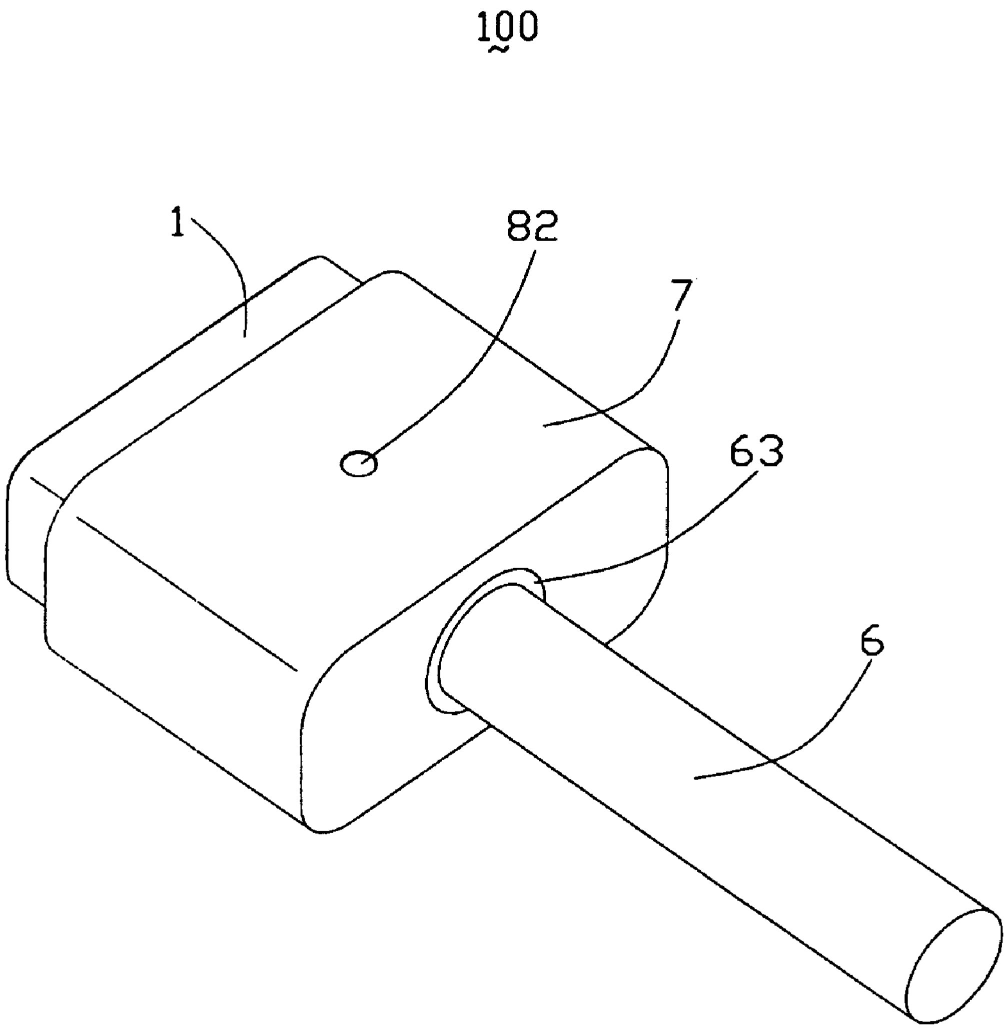
FIG. 8 is a view similar to FIG. 7, but viewed from a different aspect.
Figure 15:
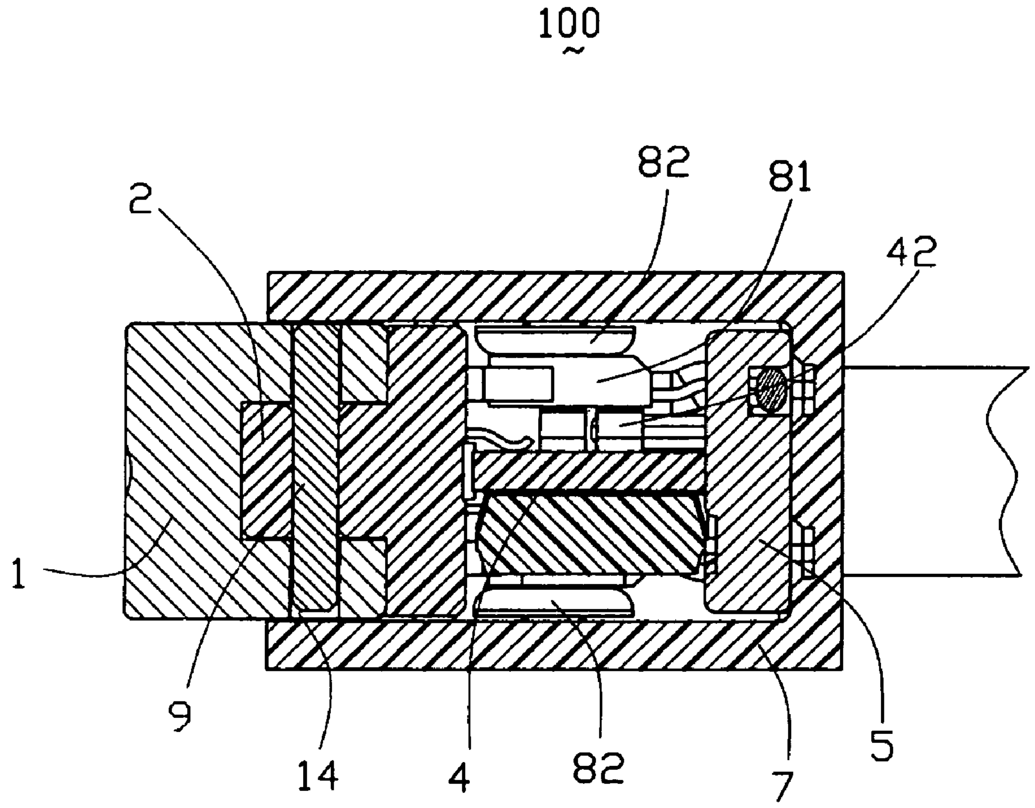
Figure 16:
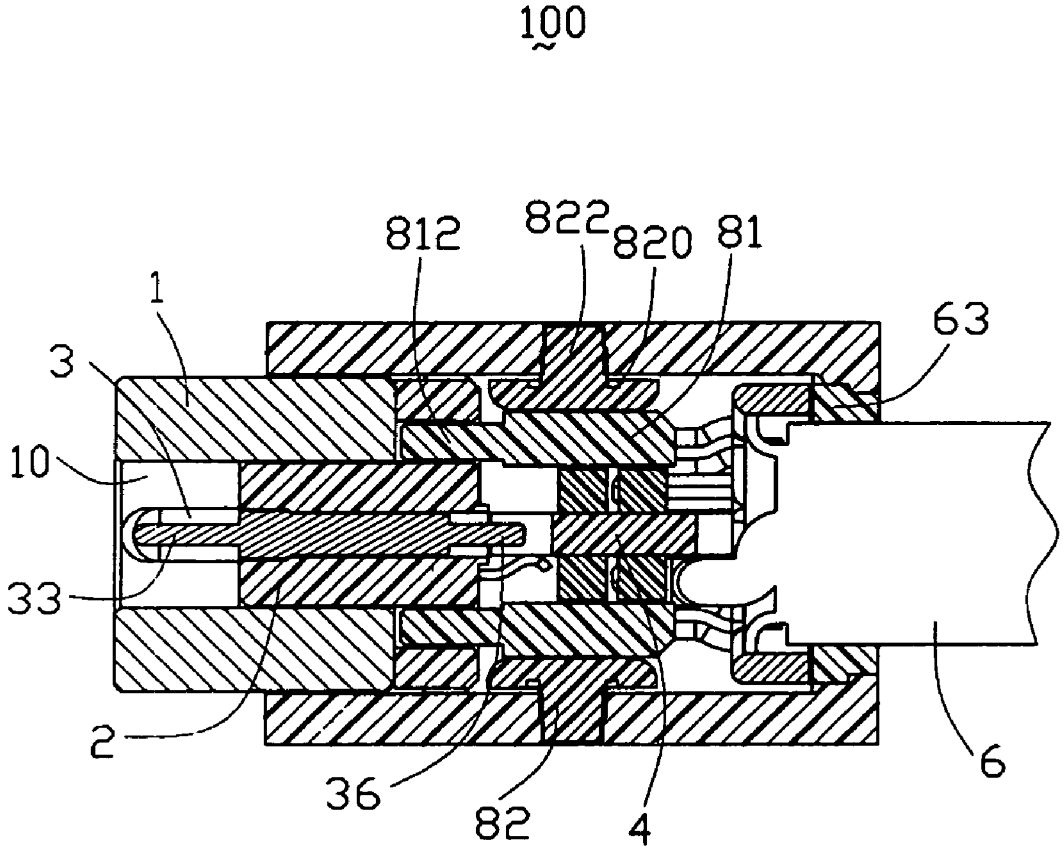
Figure 17:
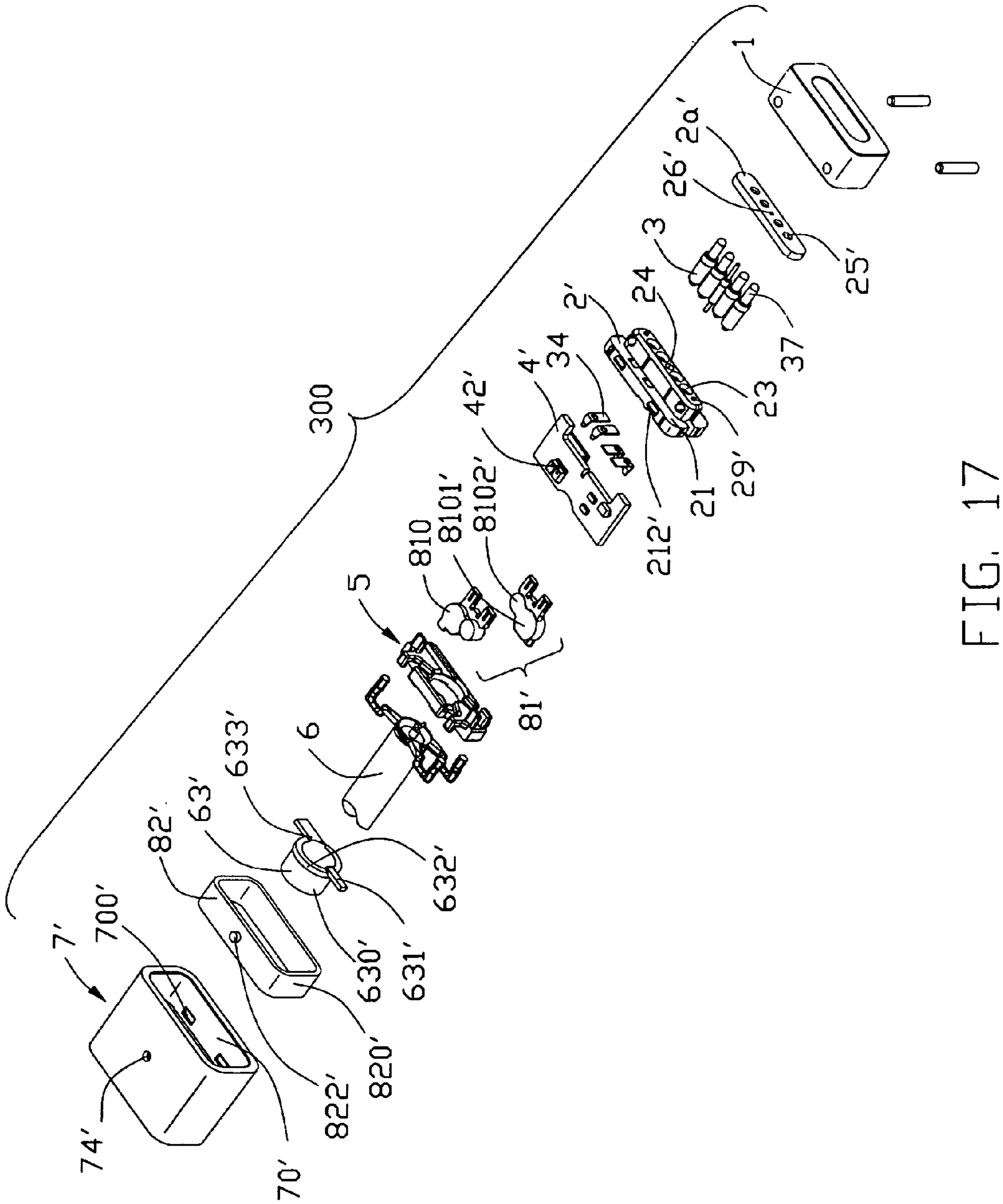
FIG. 17 is an exploded, perspective view of a cable connector assembly in accordance with the second embodiment of the present invention.
Figure 18:
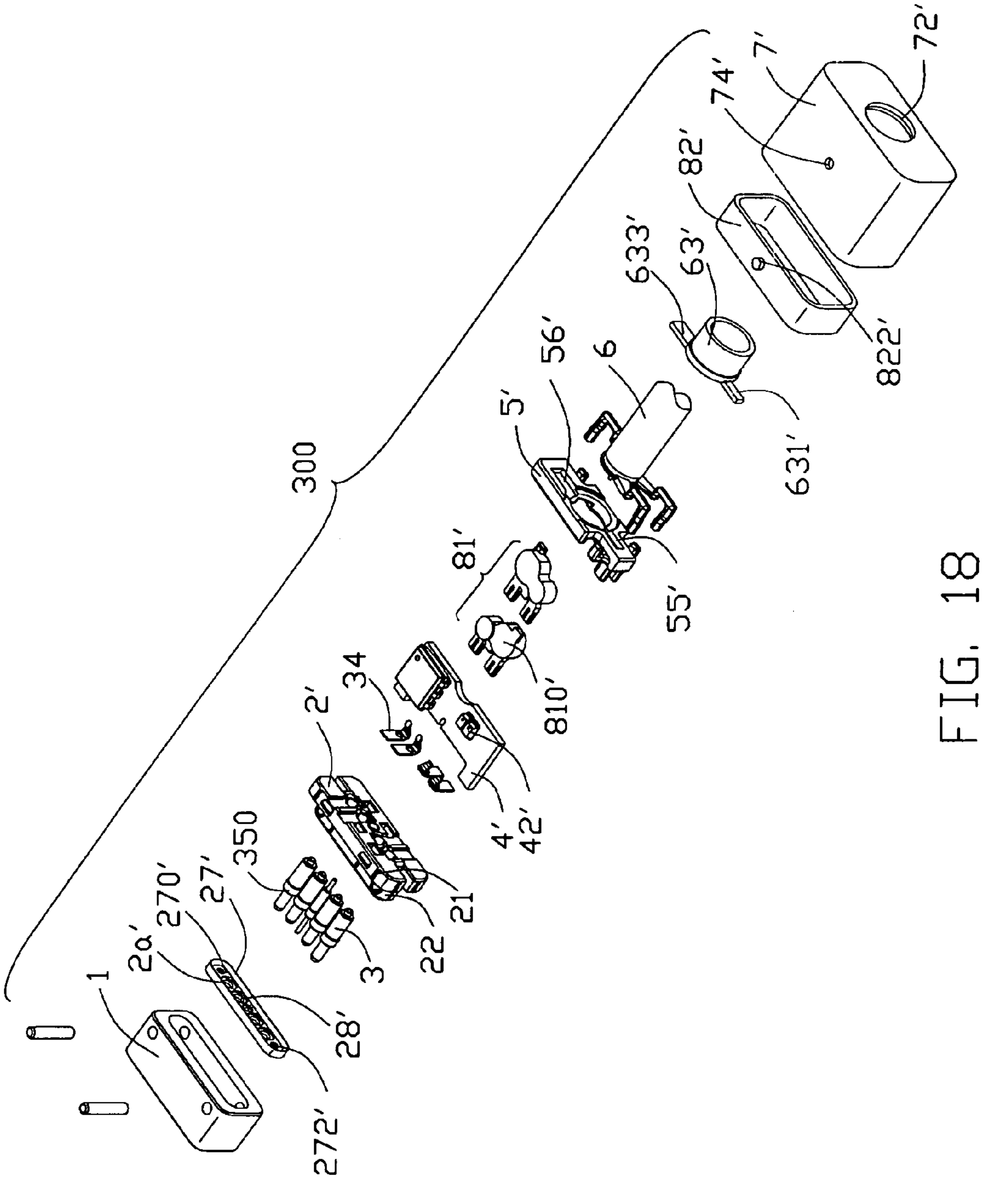
FIG. 18 a view similar to FIG. 17, but viewed from a different aspect.
Figure 19:
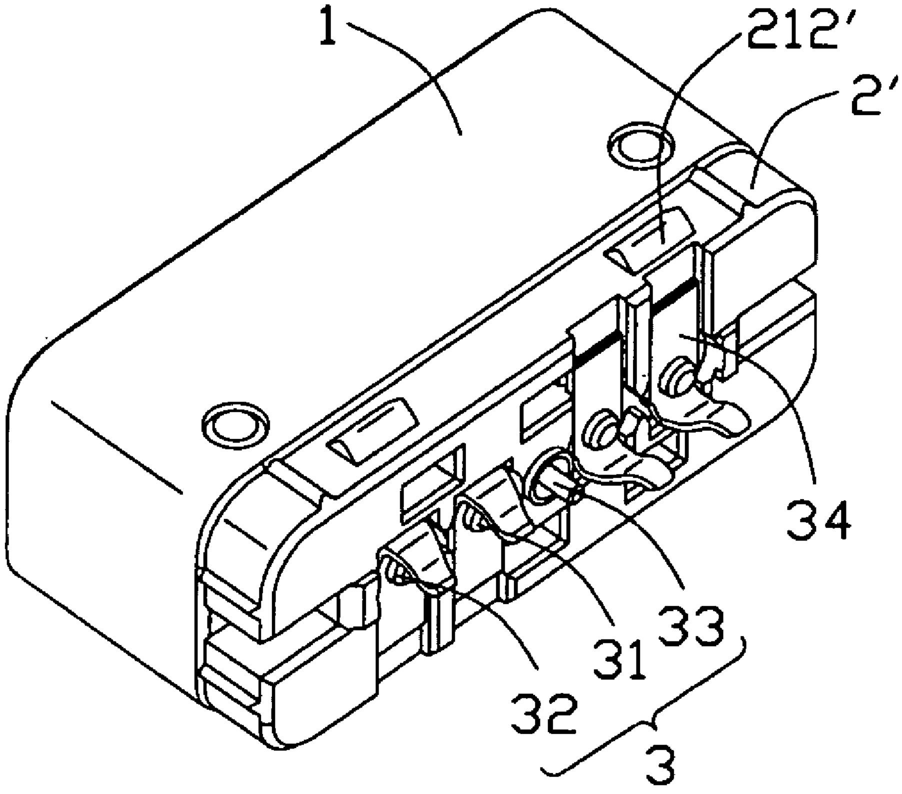
FIG. 19 is a partially assembled view of the cable connector assembly of the second embodiment.
Figure 20:
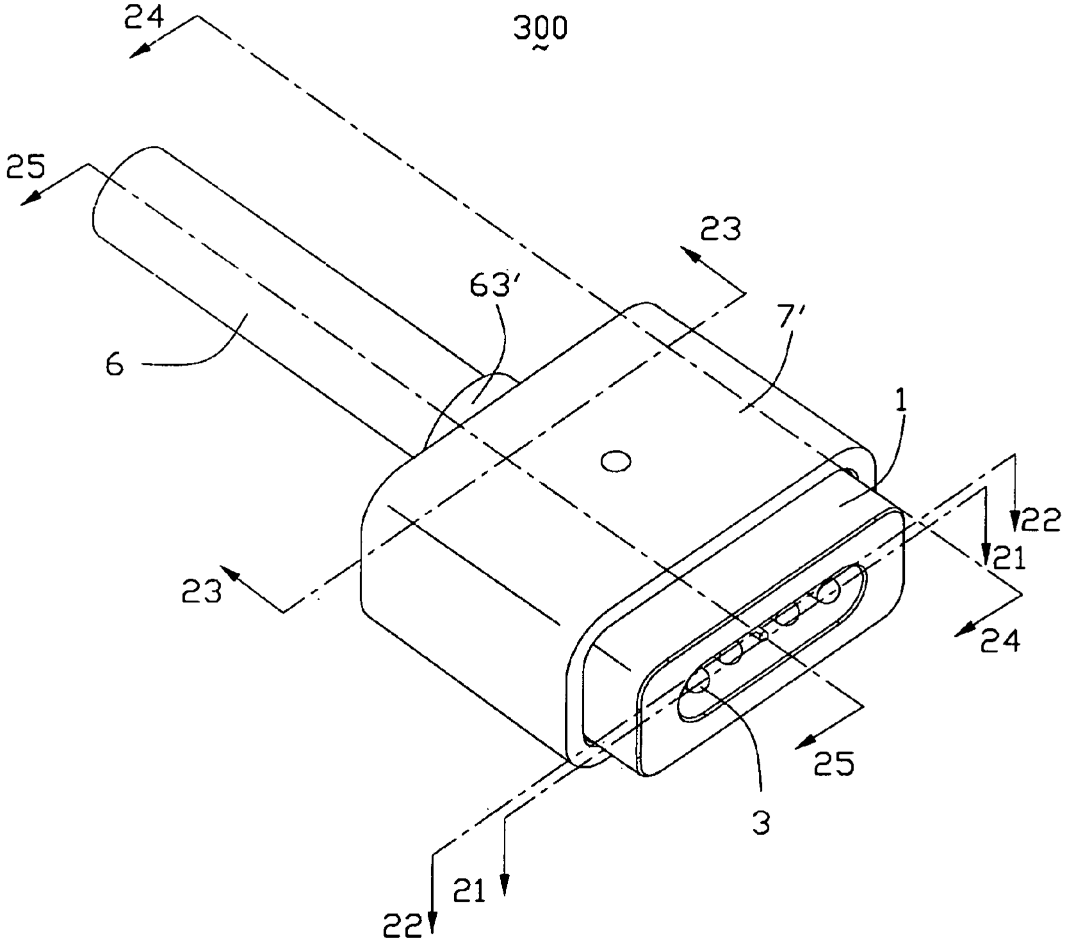
FIG. 20 is an assembled, perspective view of FIG. 17.
Figure 21:
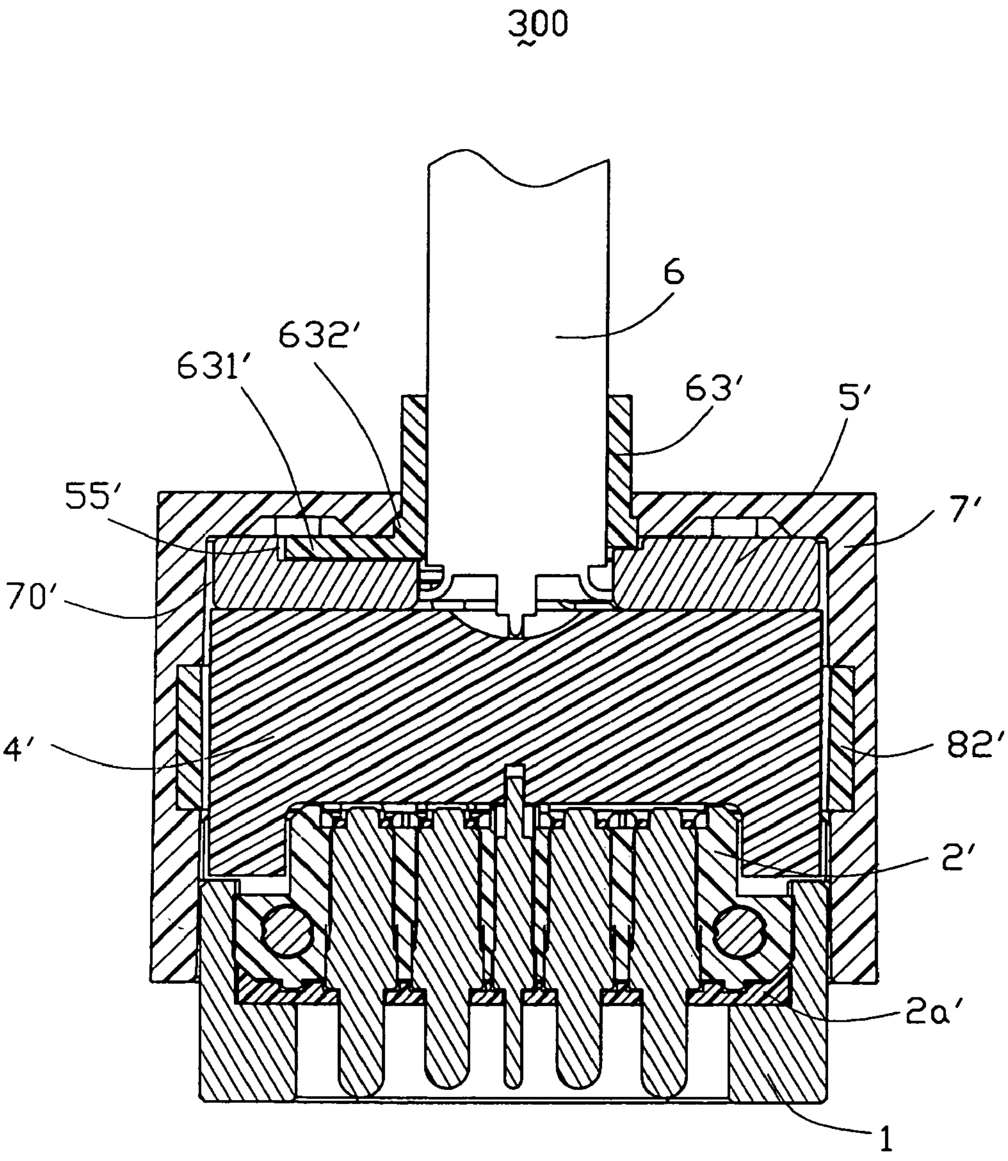
FIGS. 21–25 are cross-section views taken along lines 21—21 to 25—25 of FIG. 20.
Figure 22:
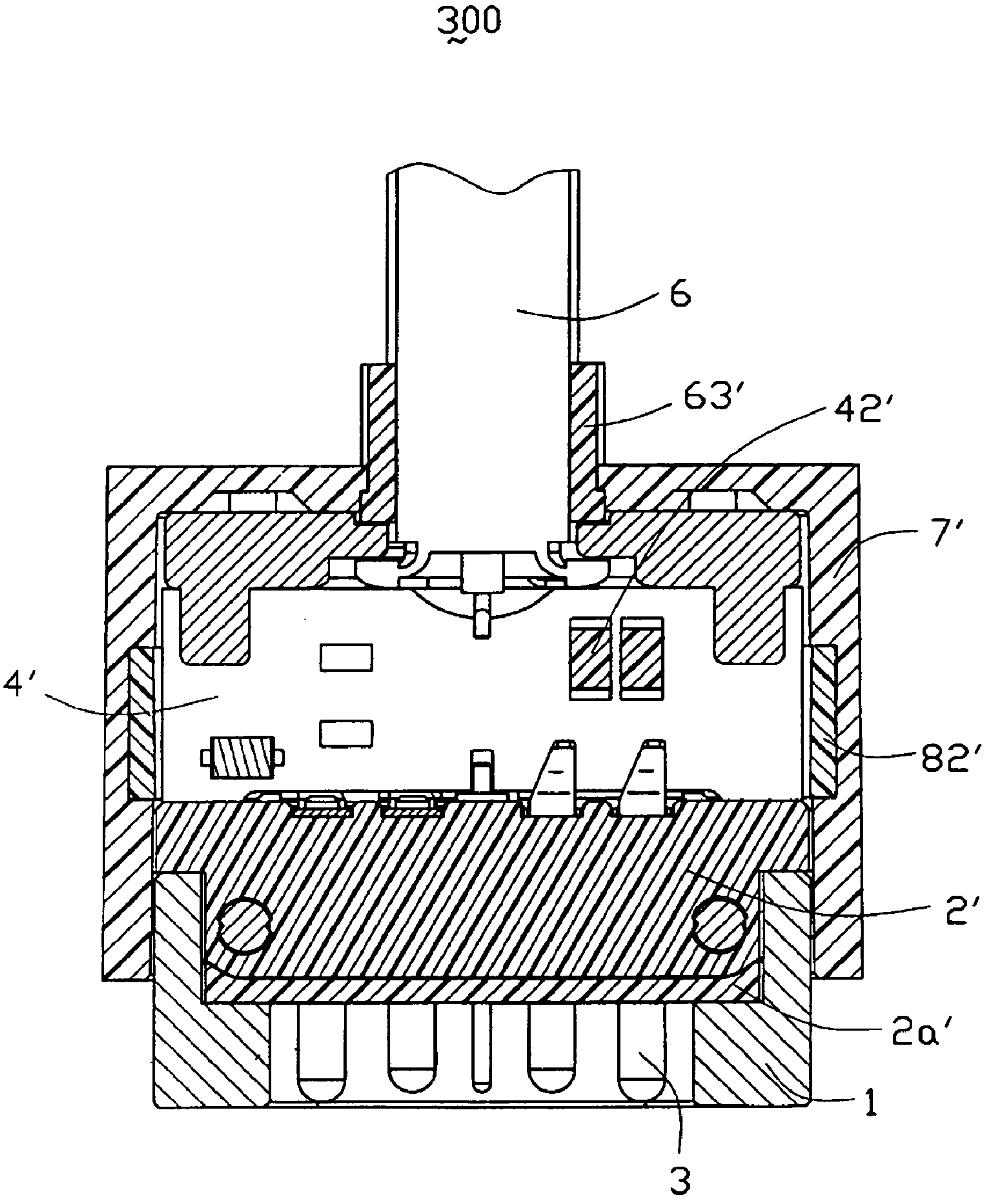
Figure 23:
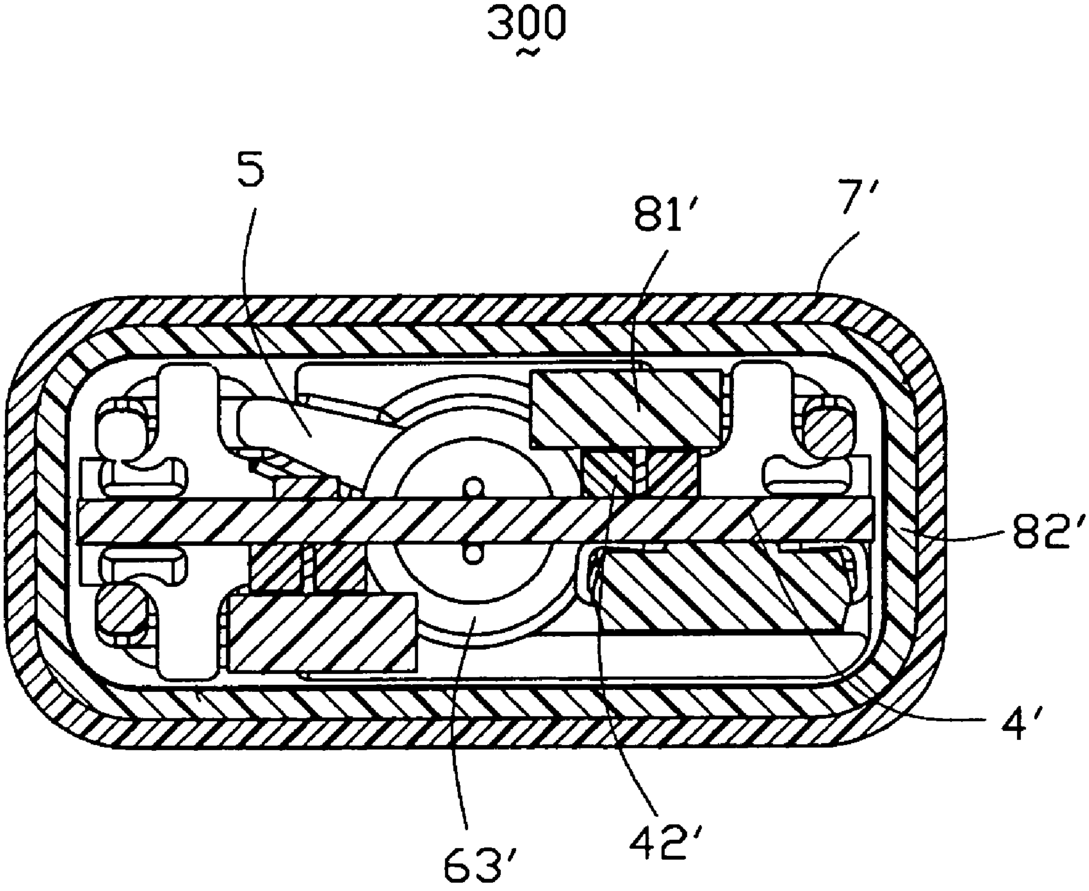
Figure 24:
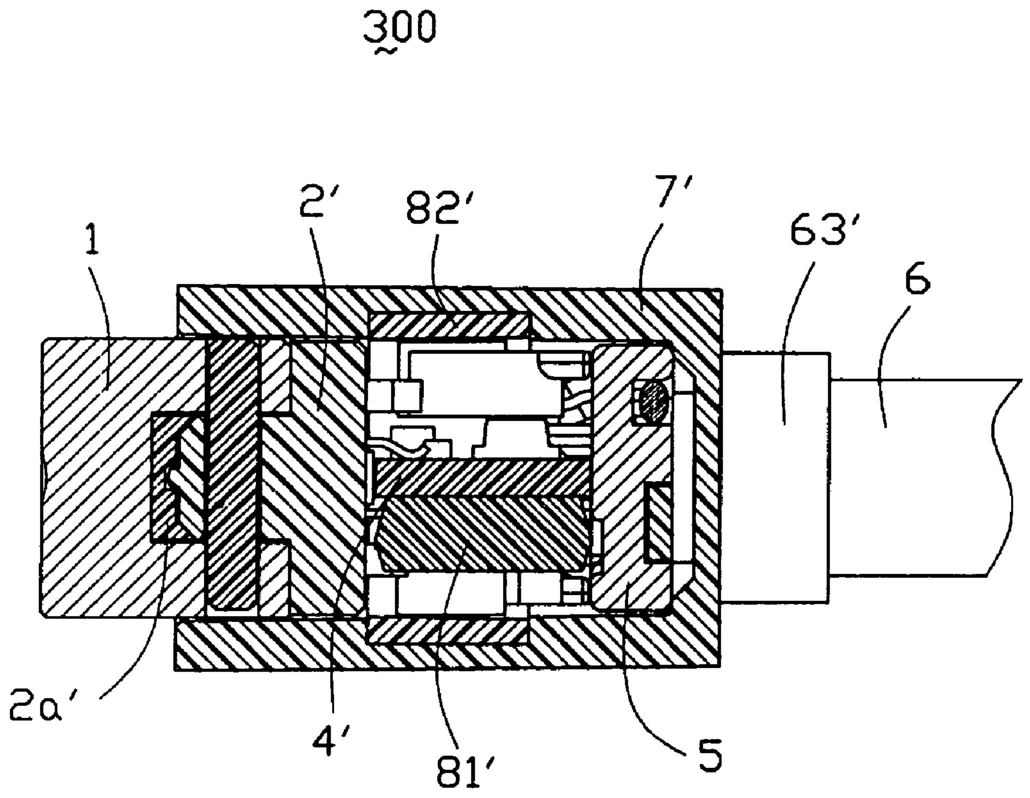
Figure 25:
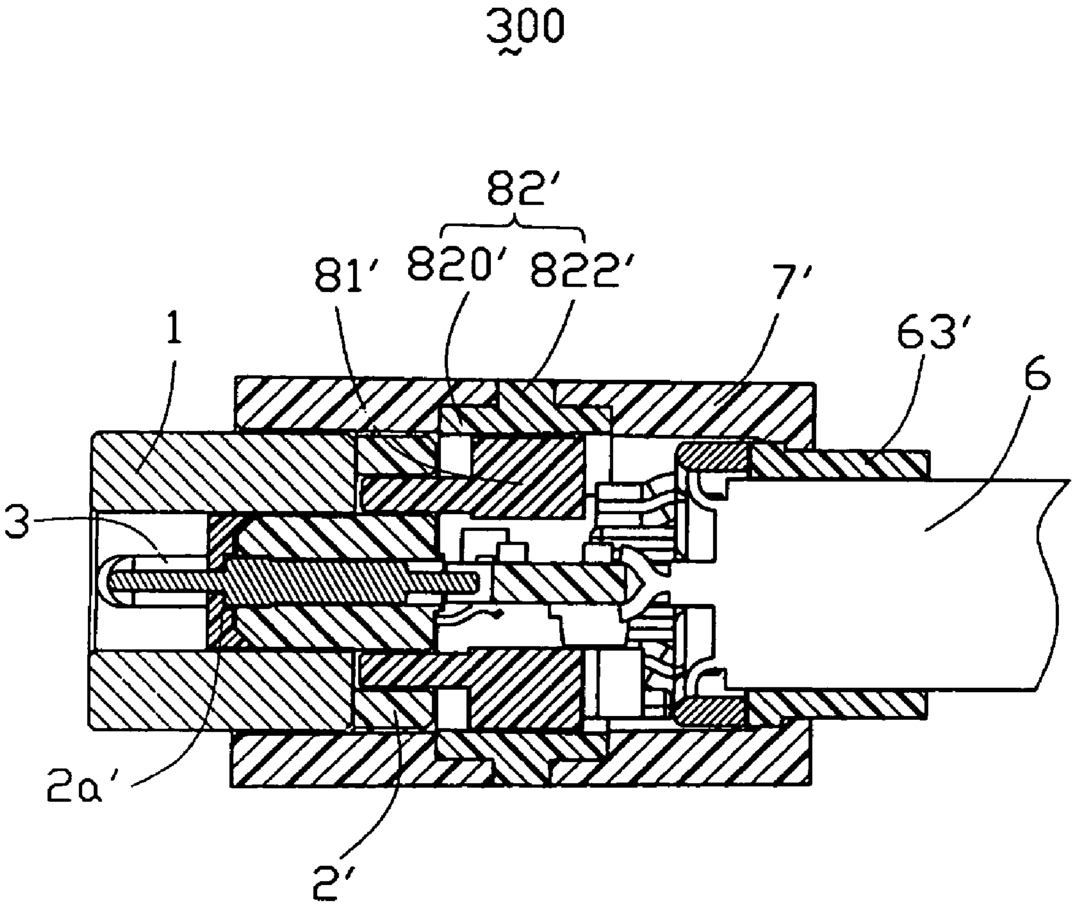

Then referring to FIG. 7 in conjunction with FIGS. 11 and 15, the front cover 1 is assembled to the housing 2 via a pair of pins 9. The tongue portion 22 is firstly inserted into the receiving passage 12 of the front cover 1 until the front surface thereof abuts against the step portions 16 of the front cover 1 and the base portion 21 abuts against a rear surface of the front cover 1. Thus, the tongue portion 22 is frictionally received in the receiving passage 12 of the front cover 1 by means of the pair of second friction ribs 220. Furthermore, the contacting portions 37 are exposed in the receiving cavity 10 with tip ends of the ground contacts 32 substantially coplanar with a front surface of the front cover 1. The pair of first engaging holes 222 respectively align with the pair of second engaging holes 14 of the front cover 1 in the vertical direction, thus, the pair of pins 9 respectively inserts through the second engaging holes 14 and the first engaging holes 222 to position the front cover 1 relative to the housing 2. Of course, the engagement between the front cover 1 and the housing 2 also can be realized by other means, such as using glue, latch means et al.

Figure 5:
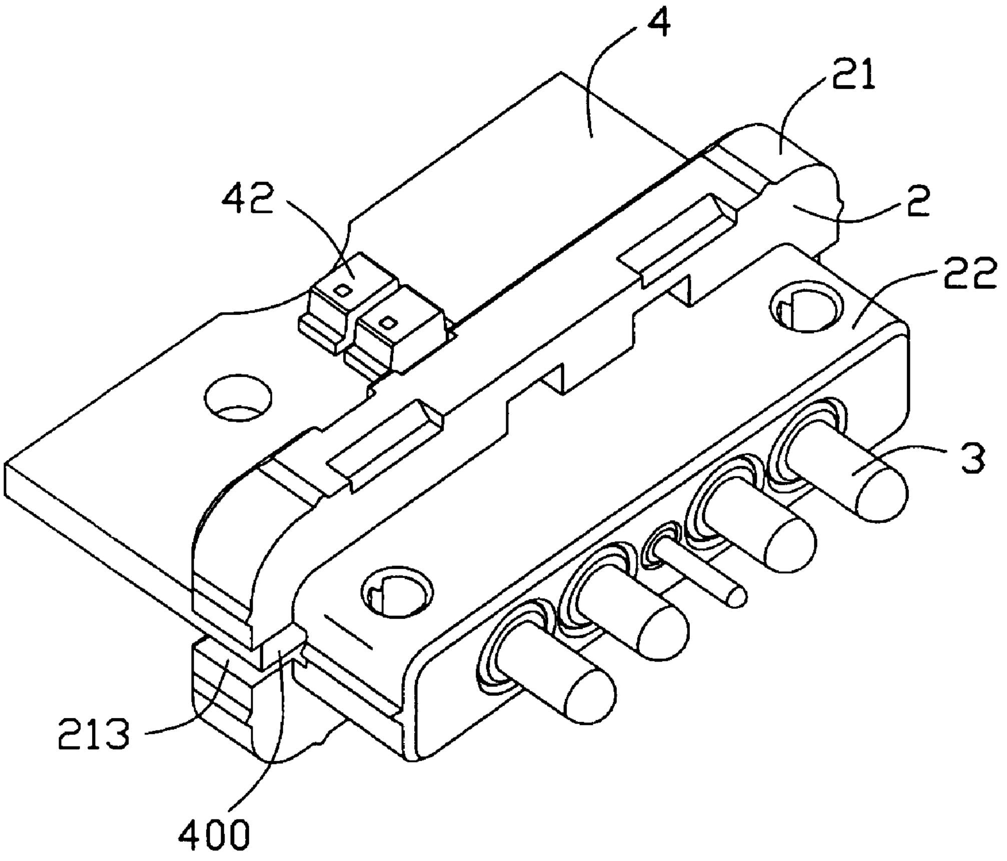
FIGS. 5–6 are partially assembled views of the cable connector assembly shown in FIG. 1, but viewed from different aspects.
Figure 6:
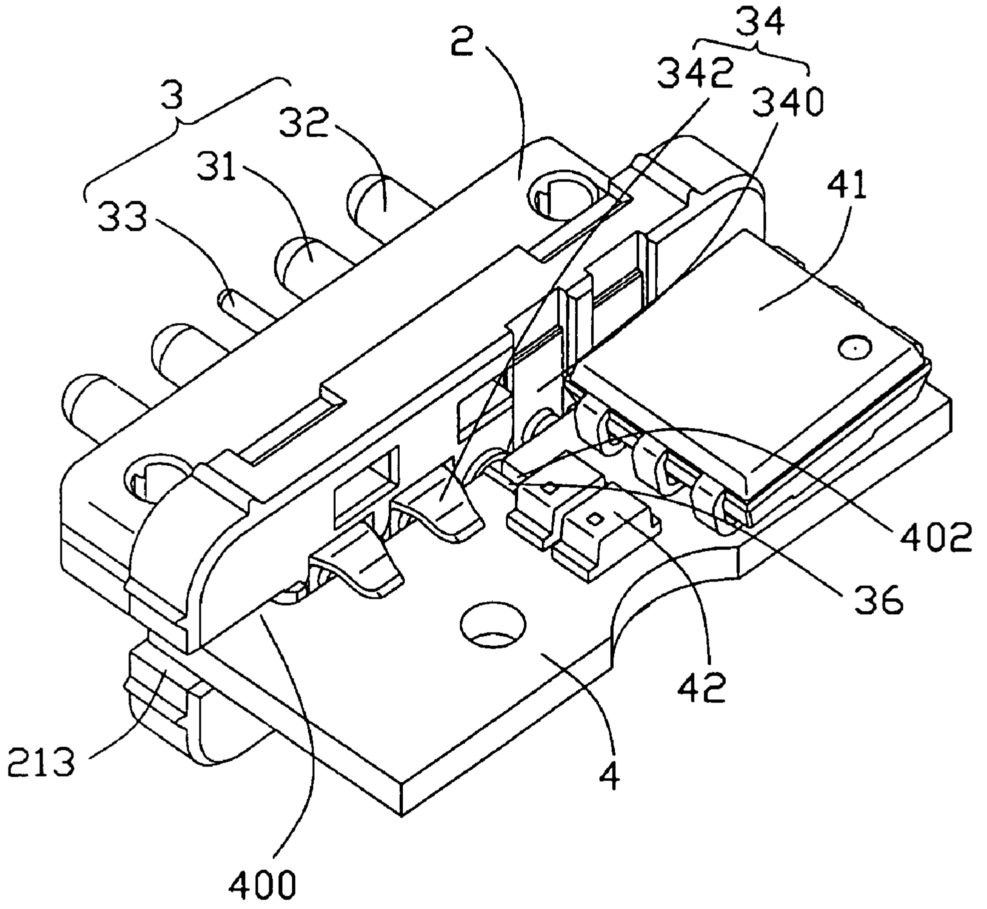

Then, referring to FIGS. 5–6 in conjunction with FIGS. 11 and 14–16, the circuit board 4 is assembled to the housing 2 and electrically connects with the conductive elements 34 and the end portion 36 of the detect contact 33 for forming electrical connection with the contacts 3. The pair of stretching arms 400 are respectively received in the second slots 213 with the guidance of the pair of tapered protrusions 214. The two pairs of opposite oriented curved tail portions 342 are respectively soldered to corresponding traces on opposite upper and lower surfaces of the circuit board 4 to sandwich the circuit board 4 therebetween and form electrical connection with the circuit board 4. The end portion 36 of the detect contact 33 is received in a slit 402 rearward extending from a middle of a front edge of the circuit board 4 to directly electrically connect with the pair of LEDs 42.

Now referring to FIGS. 1–3 in conjunction with FIGS. 9 and 13–15, the pair of first light pipes 81 are respectively assembled to the housing 2 with the pair of first and second engaging sections 812, 814 respectively frictionally received in the first slots 211 of the housing 2 via the ribs 816 formed thereon. Therefore, the first body sections 810 of the first light pipes 81 are respectively locate above corresponding LEDs 42 of the circuit board 4 for spreading the light emitting from the LEDs 42 outwardly.

Figure 9:
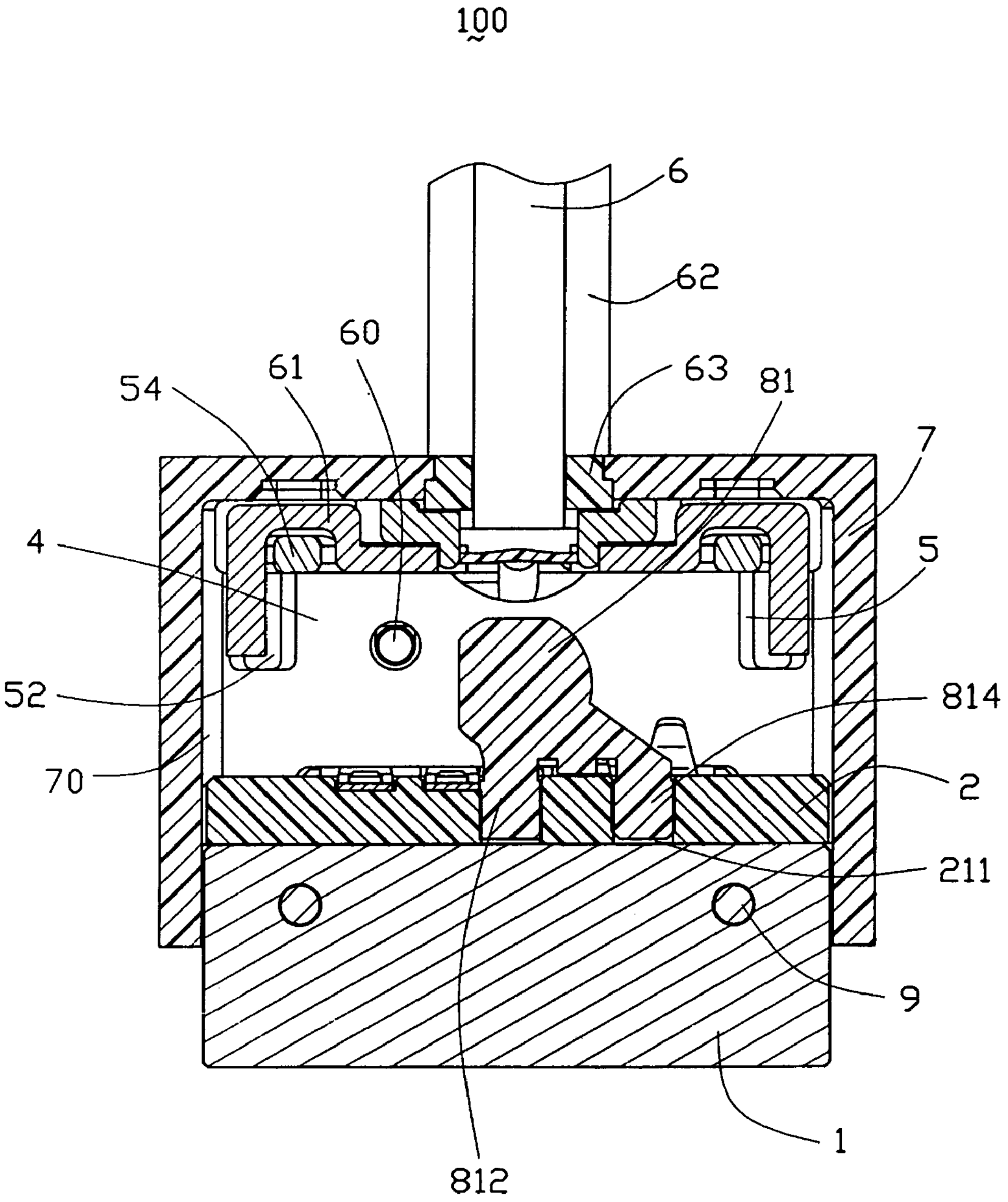
FIGS. 9–16 are cross-section views taken along lines 9—9 to 16—16 of FIGS. 7–8.
Figure 13:
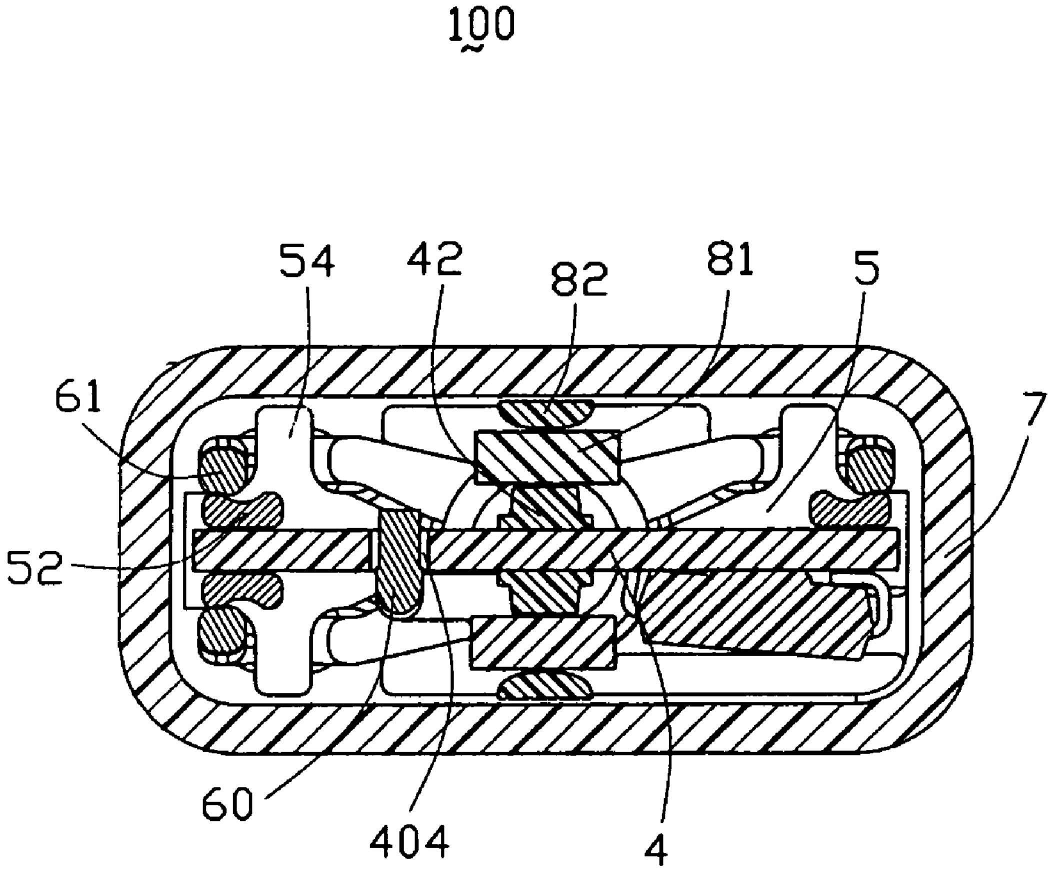
Figure 14:
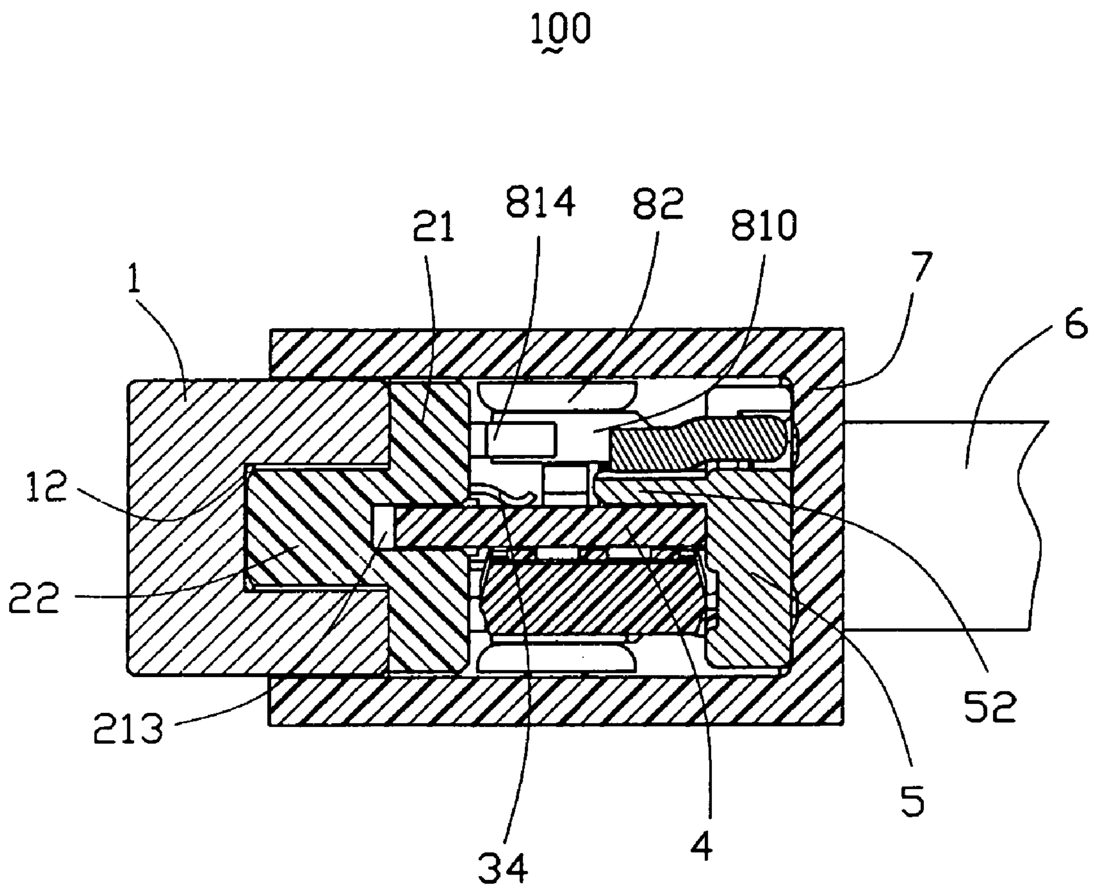

Now referring to FIGS. 1–3 in conjunction with FIGS. 9, 11 and 13, the cable 6 is firstly assembled to the strain relief member 5 then assembled to the circuit board 4 together with the strain relief member 5. The inner conductor 60 protrudes through the through hole 500 of the strain relief member 5, and the three parts of the metal braiding layer 61 firstly wrap to the routing portions 54 with forward portions located in the recess areas 520 of the jointing portions 52. Then, the forward portions of the metal braiding layer 61 are soldered with the jointing portions 52 to form electrical connection with the strain relief member 5. The strain relief member 5 is assembled to a rear end of the circuit board 4 with the jointing portions 52 thereof respectively soldered with opposite upper and lower surfaces of the circuit board 4 and the inner conductor 60 received in the wire-receiving hole 404 of the circuit board 4 and soldered with the circuit board 4. Therefore, the electrical connection between the cable 6 and the circuit board 4 further with the contacts 3 is established. The stuffing member 63 is assembled to the cable 6 from a rear-to-front direction and locates adjacent to front end of the outer jacket 62.

Referring to FIGS. 1–3 in conjunction of FIGS. 7–11, the pair of second light pipes 82 are respectively assembled to the rear cover 7 in a back-to-front manner with the positioning sections 822 respectively located in the pair of receiving holes 74 and the second body sections 820 thereof respectively abutting against opposite inner upper and lower surfaces of the rear cover 7. Then, the rear cover 7 with the pair of second light pipes 82 is engagingly assembled to the housing 2 with the protrusions 700 thereof respectively latching into the cutouts 212 of the housing 2 and the first friction ribs 210 of the housing 2 frictionally engaging with inner periphery of the rear cover 7 to reinforce the engagement therebetween. Thus, a rear portion of the front cover 1, the circuit board 4, the first light pipes 81, the strain relief member 5 and the front end of the cable 6 and the stuffing member 63 are respectively received in the receiving space 70 of the rear cover 7. The cable 6 protrudes through the stepped receiving passage 72 with the stepped-shape stuffing member 63 received in the stepped receiving passage 72 to fill spare space of the receiving passage 72. Meanwhile, the pair of second body sections 820 of the pair of second light pipes 82 respectively align with corresponding first body sections 810 of the first light pipes 81. Thus, the pair of LEDs 42, the pair of first light pipes 81 and the pair of second light pipes 82 are in a stacked relationship in the vertical direction. Once the cable connector assembly 100 mates with the complementary connector normally, the LEDs 42 emit light outwardly, and the light may permeate through the pair of first light pipes 81 then to the second light pipes 82 to indicate the user the normal status of the cable connector assembly 100. Of course, in alternative embodiment, may not adopt the light pipes 81, 82, while, make the rear cover 7 of transparent or semitransparent material to spread the light emitting from LEDs 42 directly for indication. Furthermore, the rear cover 7 may be molded to the above elements to achieve reliable engagement.

Now referring to FIGS. 17–25, a cable connector assembly 300 in accordance with the second embodiment of the present invention is illustrated.

The first difference between the cable connector assembly 300 and the cable connector assembly 100 is that the cable connector assembly 300 comprises a cosmetic element **2*a*' assembled to the housing 2' for cosmeticize the visual effect of the cable connector assembly 300. The cosmetic element 2*a*' is of ellipse-shape and defines four first channels 25' and a second channel 26' corresponding to the first receiving passages 23 and the second receiving passage 24 of the housing 2' with dimensions corresponding to the diameters of the contacting portions 37 of the contacts 3. An entranceway 27' is recessed forwardly from a rear surface of the cosmetic element 2*a*', thus, forming an inner front face 270'. A plurality of different-size passageways 28' recess forwardly from the inner front face 270' to communicate with corresponding first and second channels 25', 26' with dimensions corresponding to the diameters of the engaging sections 350 of the contacts 3. A pair of positioning recesses 272' also recesses forwardly from the inner front face 270' and locates at opposite sides of the cosmetic element 2*a*'. Corresponding to the structures of the cosmetic element 2*a*', the tongue portion 22' is shortened along the front-back direction and a front end thereof is tapered to form a slant edge along outer periphery thereof for facilitating the assembly of the cosmetic element 2***a*' and received in the entranceway 27'. The housing 2' forms a pair of positioning protrusions 29' to be received into the positioning recesses 272' of the cosmetic element 2*a*' for positioning the right position of the cosmetic element 2*a*'. After the cosmetic element 2*a*' is assembled to the housing 2' and the contacts 3, the portions of the engaging sections 350 exposed outside of the housing 2' and the contacting portions 37 of the contact 3 are respectively received in the passageways 28' and the first and second channels 25', 26', thus, the front visual effect is improved. The housing 2' with the cosmetic element 2*a*' is assembled to the front cover 1 as described above, thus, same detailed description is omitted here.

The second difference exists in the circuit board 4'. The pair of LEDs 42' is moved from the middle of the circuit board 4 to opposite right side and left side relative to the middle axis extending along front-back direction. Corresponding to the structure change of the circuit board 4', the first body section 810' of the first light pipe 81' comprises a first section 8101' overlapping corresponding LED 42' and a second section 8102' connecting with the first section 8101' and aligning with corresponding structure of the second light pipe 82'.

The third difference is the shape of the stuffing member 63' is different from that of the stuffing member 63. The stuffing member 63' comprises a circular main portion 630', an enlarged stuff portion 632' formed at front end of the main portion 630', and a pair of first and second orientation portions 631', 633' extending transversely from outer edge of the stuff portion 632' with different widths along the vertical direction. In addition, the first and second orientation portions 631', 633' are arranged with unsymmetrical relationship with the first orientation portion 631' locating at an upper position than the second orientation portion 633' along the vertical direction. Correspondingly, the strain relief member 5 defines first and second slots 55', 56' to receive the first and second orientation portions 631', 633' for orientating the stuffing member 63' in position.

Different from the cable connector assembly 100, the cable connector assembly 300 forms the second light pipe 82' and the rear cover 7' by means of injection or molding. Firstly, the second light pipe 82' is molded from transparent or semitransparent material and comprises a belt-shape second body section 820' and a pair of positioning sections 822' respectively formed on middle areas of the upper and lower walls of the second body section 820'. Secondly, the rear cover 7' is molded over the second light pipe 82' to receive the second light pipe 82' therein. The rear cover 7' defines a receiving cavity 70' recessed rearwardly from a front surface thereof to communicate with a stepped receiving passage 72' in a rear edge thereof. The belt-shape body section 820' is received in a middle annular passage (not labeled) recessed outwardly from inner periphery of the rear cover 7' with the pair of positioning sections 822' respectively received in a pair of circular receiving holes 74' in upper and lower surfaces of the rear cover 7' to be exposed outside for indication. Then, the second light pipe 82' and the rear cover 7' together assembled to the assembly described above with a rear end of the front cover 1, the housing 2', the conductive elements 34, the circuit board 4', the first light pipes 81', the strain relief member 5, and the front end of the cable 6 received in the receiving cavity 70' of the rear cover 7'. Corresponding to the protrusions 212' formed on upper and lower surfaces of the base portion 21 of the housing 2', the rear cover 7' forms two pairs of cutouts 700' to receive the protrusions 212' therein for increasing the retaining force between the housing 2' and the rear cover 7'. The second sections 8102' of the first light pipes 81' respectively align with the positioning sections 822' of the second light pipes 82' to spread the light emitting from the LEDs 42' to outside for indication. In addition, the enlarged stuff portion 632' received in the stepped receiving passage 72' with the main portion 630' exposed beyond the rear cover 7'.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A cable connector assembly adapted for electrically connecting with a complementary connector along a mating direction, comprising:

an insulative housing defining a plurality of receiving passages extending therethrough along said mating direction;

a plurality of contacts respectively received in the receiving passages, each contact comprising a mating portion exposed beyond one end corresponding receiving passage, a media portion engagingly received in said receiving passage, and an end portion exposed beyond the other end of said receiving passage;

a circuit board assembled to the insulative housing;

a plurality of conductive elements, each conductive element comprising a connecting portion electrically connecting with the end portion of corresponding contact and a tail portion soldered with one end of the circuit board;

a cable electrically connecting with the circuit board;

a front cover made of metal material and capable of attracted by said complementary connector, said front cover assembled to the housing with the contacting portions of the contacts exposed in the front cover; and a rear cover assembled to the housing to enclose rear of the housing, the conductive elements, the circuit board and front end of the cable; and a strain relief member electrically connecting with the circuit board and the cable.

2. The cable connector assembly as claimed in claim 1, wherein the conductive elements are divided into two groups oriented in opposite directions, and wherein the tail portions of the two groups of the conductive elements are respectively attached to opposite upper and lower surfaces of the circuit board to sandwich front end of the circuit board.

3. The cable connector assembly as claimed in claim 1, wherein each contact is of a POGO-type and the contacting portion thereof is capable of being actuated to move along a mating direction when the cable connector assembly mates with the complementary connector.

4. The cable connector assembly as claimed in claim 1, wherein the contacts comprise a pair of ground contacts, a pair of power contacts and a center detect contact, and wherein the end portions of the power and ground contacts are substantially coplanar with the rear face of the insulative housing.

5. The cable connector assembly as claimed in claim 4, wherein the insulative housing defines a plurality of recesses recessed forwardly from the rear face thereof to communicate with corresponding receiving passages, and wherein the end portions of the power contacts and the ground contacts are respectively received in the recesses, and the connecting portions of the conductive elements are received in corresponding recesses to solder with corresponding end portions.

6. The cable connector assembly as claimed in claim 5, wherein the end portion of each of the ground contacts and power contacts is of column shape and each conductive element is of L-shape, and wherein the connecting portion of each conductive element defines a receiving opening to permit the end portion extending therethrough.

7. The cable connector assembly as claimed in claim 4, further comprising status indicator means assembled to the circuit board, wherein the circuit board comprises a light emitting diode, and wherein the detect contact is electrically connected with the LED for indication.

8. The cable connector assembly as claimed in claim 7, wherein the status indicator means overlaps said LED for spreading the light emitted by the LED outwardly to indicate the normal status of the cable connector assembly and a complementary connector.

9. The cable connector assembly as claimed in claim 7, wherein the status indicator means comprises a first light pipe overlapping the LED and a second light pipe overlapping the first light pipe and assembled to the rear cover to spread the light.

10. The cable connector assembly as claimed in claim 9, wherein the first light pipe comprises a first body portion aligning with the LED and an engaging section extending forwardly from the first body portion to interferentially received in the insulative housing.

11. The cable connector assembly as claimed in claim 9, wherein the second light pipe comprises a second body section aligning with the first light pipe and a positioning section extending from the second body section, and wherein the rear cover defines a receiving holes therethrough to receive the positioning section.

12. The cable connector assembly as claimed in claim 1, wherein the cable comprises an inner conductor protruding through the stain relief member to directly electrically connect with the circuit board, and a metal braiding layer electrically connecting with the strain relief member.

13. The cable connector assembly as claimed in claim 1, wherein the strain relief member forms a jointing portion extending forwardly therefrom to be soldered with the circuit board and the metal braiding layer of the cable.

14. A cable connector assembly comprising:

an insulative housing defining a mating port;

a plurality of contacts disposed in the housing;

a printed circuit board located on a rear side of the housing;

a plurality of L-shaped metallic pieces located between the housing and printed circuit board, each of said metallic piece including a vertical section through which a tail of the contact extends, and a horizontal section soldered upon a front edge of the printed circuit board; wherein said metallic pieces are arranged with two groups located by two sides of a vertical center line of the mating port while in a mirror image with each other so as to form a complementary manner of the whole assembly.

15. The cable connector assembly as claimed in claim 14, wherein a detect contact is located on said center line and has a tail extends into a silt of the printed circuit board.

16. The cable connector assembly as claimed in claim 15, wherein the horizontal sections of the two groups and the tail of the detect contact are essentially located at three different levels.

* * * * *

UNITED STATES PATENT AND TRADEMARK OFFICE

CERTIFICATE OF CORRECTION

PATENT NO. : 7,217,142 B1
APPLICATION NO. : 11/481151
DATED : May 15, 2007
INVENTOR(S) : Jerry Wu It is certified that error appears in the above-identified patent and that said Letters Patent is hereby corrected as shown below:

In column 3, line 60, delete "direciton." and insert -- direction. --, therefor.

In column 10, line 3, in Claim 12, delete "stain" and insert -- strain --, therefor.

Signed and Sealed this
First Day of November, 2011

David J. Kappos

David J. Kappos
*Director of the United States Patent and Trademark Office*